(12) United States Patent
Gu-Stoppel et al.

(10) Patent No.: US 10,101,222 B2
(45) Date of Patent: Oct. 16, 2018

(54) PIEZOELECTRIC POSITION SENSOR FOR PIEZOELECTRICALLY DRIVEN RESONANT MICROMIRRORS

(71) Applicant: Fraunhofer-Gesellschaft zur Foerderung der angewandten Forschung e.V., Munich (DE)

(72) Inventors: Shanshan Gu-Stoppel, Itzehoe (DE); Hans-Joachim Quenzer, Itzehoe (DE); Joachim Janes, Itzehoe (DE); Felix Heinrich, Barmstedt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/846,299

(22) Filed: Sep. 4, 2015

(65) Prior Publication Data
US 2016/0069754 A1 Mar. 10, 2016

(30) Foreign Application Priority Data

Sep. 5, 2014 (DE) .................. 10 2014 217 799

(51) Int. Cl.
*G01L 1/00* (2006.01)
*G01L 1/16* (2006.01)
(Continued)

(52) U.S. Cl.
CPC .............. *G01L 1/167* (2013.01); *B81B 3/00* (2013.01); *G01L 5/00* (2013.01); *G02B 26/0858* (2013.01); *H01L 41/0926* (2013.01)

(58) Field of Classification Search
CPC .. G01L 1/167; G01L 5/00; B81B 3/00; G01B 7/16; G01B 7/18; G01B 5/30; G02B 25/0858; H01L 41/0926
(Continued)

(56) References Cited

U.S. PATENT DOCUMENTS 6,449,079 B1 * 9/2002 Herrmann .......... G02B 26/0841
359/213.1
2004/0180517 A1 * 9/2004 Quenzer ............. B81C 99/0085
438/479
(Continued)

FOREIGN PATENT DOCUMENTS

CN 103787265 A 5/2014
DE 19857946 C1 1/2000
(Continued)

OTHER PUBLICATIONS

Baran, Utku et al., "Resonant PZT MEMS Scanners With Integrated Angle Sensors", 2013 International Conference on Optical Mems and Nanophotonics, IEEE, Aug. 17, 2014, pp. 99-100.
(Continued)

*Primary Examiner* — Manish S Shah
*Assistant Examiner* — Nigel Plumb
(74) *Attorney, Agent, or Firm* — Perkins Coie LLP; Michael A. Glenn (57) ABSTRACT

Embodiments of the present invention provide an apparatus including a micromirror, an excitation structure containing or supporting the micromirror, and at least one piezoelectric sensor. The excitation structure includes at least one piezoelectric actuator, the excitation structure being configured to resonantly excite the micromirror so as to cause a deflection of the micromirror. The at least one piezoelectric sensor is configured to provide a sensor signal dependent on the deflection of the micromirror, the piezoelectric sensor being connected to the excitation structure so that during the resonant excitation of the micromirror, the sensor signal and the deflection of the micromirror exhibit a fixed mutual phase relationship.

14 Claims, 6 Drawing Sheets

(51) Int. Cl.
  *G01L 5/00* (2006.01)
  *B81B 3/00* (2006.01)
  *G02B 26/08* (2006.01)
  *H01L 41/09* (2006.01)

(58) Field of Classification Search
  USPC ............................ 73/774, 763, 760, 781, 855
  See application file for complete search history.

(56) References Cited

U.S. PATENT DOCUMENTS

| | | | |
|---|---|---|---|
| 2009/0185253 A1* | 7/2009 | Tani | G02B 26/0858 359/221.2 |
| 2009/0293632 A1* | 12/2009 | Conrad | G01L 1/18 73/777 |
| 2010/0097681 A1* | 4/2010 | Klose | B81B 3/0062 359/213.1 |
| 2010/0296151 A1* | 11/2010 | Hofmann | B81B 3/0054 359/291 |
| 2014/0118005 A1 | 5/2014 | Heinzelmann et al. | |
| 2014/0159827 A1* | 6/2014 | Hofmann | B81B 3/0018 331/154 |

FOREIGN PATENT DOCUMENTS

| | | | | |
|---|---|---|---|---|
| DE | 102008049647 A1 | 4/2010 | | |
| EP | 2706393 A1 | 3/2014 | | |
| JP | WO 2014050586 | * | 5/2014 | .............. G01L 1/16 |
| WO | 2014050586 A1 | 4/2014 | | |

OTHER PUBLICATIONS

Gu-Stoppel, Shanshan et al., "Two-Dimensional Scanning Using Two Signle-Axis Low Voltage PZT Resonant Micromirrors", Proc. SPIE 8977, MOEMS and Miniaturized Systems XIII, 897706, Mar. 7, 2014, 1-9.

Baran, Utku et al., "Resonant PZT MEMS Scanner for High-Resolution Displays", Journal of Microelectromechanical Systems, vol. 21, No. 6, Dec. 2012.

Gu-Stoppel, "Piezoelectric resonant micromirror with high frequency and large deflection applying mechanical leverage amplification", Proc. of SPIE vol. 8612, 2013.

Gu-Stoppel, S., "Design, Fabrication and Characterization of Low-Voltage Piezoelectric Two-Axis Gimbal-Less Microscanners", Transducers 2013, Barcelona, Spain, Jun. 16-20, 2013.

* cited by examiner

Resonantly exciting a micromirror by means of an excitation structure so as to cause a deflection of the micromirror, the excitation structure supporting the micromirror and comprising at least one piezoelectric actuator; and ~302

Providing a sensor signal dependent on the deflection of the micromirror by means of a piezoelectric sensor, the piezoelectric sensor being connected to the excitation structure, so that during the resonant excitation of the micromirror, the sensor signal and the deflection of the micromirror exhibit a fixed mutual phase relationship. ~304

FIG 6

PIEZOELECTRIC POSITION SENSOR FOR PIEZOELECTRICALLY DRIVEN RESONANT MICROMIRRORS

CROSS-REFERENCE TO RELATED APPLICATIONS

This application claims priority from German Patent Application No. 102014217799.5, which was filed on Sep. 5, 2014, and is incorporated herein in its entirety by reference.

Embodiments of the present invention relate to an apparatus and a method for resonantly exciting a micromirror and for providing a sensor signal dependent on a deflection of the micromirror. Further embodiments relate to a method for producing such an apparatus. Some embodiments relate to a piezoelectric position sensor of piezoelectrically driven resonant micromirrors.

BACKGROUND OF THE INVENTION

Possibilities of detecting a position of resonantly driven or moved MEMS devices (MEMS=micro-electromechanical system), such as of resonantly driven micromirrors, are limited. Basically, one can detect either the movement of an actuator driving the micromirror or the movement of the micromirror directly. The most common sensor principles for position measurement of a micromirror are based on piezoresistive or metallic strain measuring strips (strain gages) or on capacitive or optical methods.

Frequently, piezoresistive strain measuring strips, metallic strain measuring strips and capacitive measurement principles only detect the actuator position rather than the actual position of the micromirror, while optical methods measure the real position of the mirror. However, the above mentioned measurement methods have their specific limitations, as will be stated below.

Integrating piezoresistive sensors may use specific production materials such as doped polysilicon, for example, in order to generate a change in resistance by the mechanical tension present in the device. This results in limited implementability [C. Zhang, G. Zhang, and Z. You, "A two-dimensional micro scanner integrated with a piezoelectric actuator and piezoresistors," Sensors, vol. 9, no. 1, pp. 631-644, 2009]. In addition, piezoresistors made of a semiconductor material are sensitive also to light incidence and changes in temperature, which strongly limits the use of this class of sensors in a microdevice.

Metallic strain measuring strips benefit from the fact that many metals have a piezoresistive behavior such that their respective electric resistance changes upon deformation. Metallic strain measuring structures are significantly easier to implement than piezoresistors made of semiconductive material while having significantly poorer sensitivities. Thus, their usage involves a sufficiently large strain of either the actuators or the spring structures between actuator and micromirror [M. Cueff, E. Defaÿ, G. Le Rhun, P. Rey, F. Perruchot, A. Suhm, and M. Aïd, "Integrated metallic gauge in a piezoelectric cantilever," Sens. Actuators Phys., vol. 172, no. 1, pp. 148-153, December 2011].

Eventually, the amount of the change in resistance depends decisively on the design of the MEMS device. However, many MEMS designs lack suitable structures which on the one hand have large deformations and on the other hand provide sufficient space for a strain measuring strip [U. Baran, D. Brown, S. Holmstrom, D. Balma, W. O. Davis, P. Muralt, and H. Urey, "Resonant PZT MEMS Scanner for High-Resolution Displays," J. Microelectromechanical Syst., vol. 21, no. 6, pp. 1303-1310, December 2012]. In such MEMS devices, the usage of strain measuring strips is therefore associated with poor sensitivity and poor resolution.

Electrostatic drives use mutually attractive areas of different voltage levels as actuators. Conversely, these electrode areas can also be used as components of capacitive sensors, the sensor signals of which in turn provide information about the distances of the electrodes, which eventually provides a statement regarding the position of the micromirror [H. G. Xu, T. Ono, and M. Esashi, "Precise motion control of a nanopositioning PZT microstage using integrated capacitive displacement sensors," J. Micromechanics Microengineering, vol. 16, no. 12, p. 2747, December 2006], [T. von Wantoch, C. Mallas, U. Hofmann, J. Janes, B. Wagner, and W. Benecke, "Analysis of capacitive sensing for 2D-MEMS scanner laser projection," in Proc. SPIE 8977, MOEMS and Miniaturized Systems XIII, 2014, p. 897707]. Here, either the position of the actuators or the position of the micromirrors can be detected directly. However, what is disadvantageous here are the comparatively low signal strengths and the interference of the signals by crosstalk. Not least, the comparatively large electrode areas and their small distances cause significantly increased aerodynamic friction of the quickly moving micromirror, which is accompanied by a significant decrease in the maximum deflection of the resonant micromirror.

Optical measurements present a possibility of directly detecting the movement of the mirror plate. Here, however, an external light source, beam processing, and a detector (laser diode) may be used, which impair the compactness of a device [S. Richter, M. Stutz, A. Gratzke, Y. Schleitzer, G. Krampert, F. Hoeller, U. Wolf, L. Riedel, and D. Doering, "Position sensing and tracking with quasistatic MEMS mirrors," 2013, p. 86160D], which eventually results in complex and expensive constructions.

In addition, micromirrors as well as methods for producing same are known [S. Gu-Stoppel, J. Janes, H. J. Quenzer, U. Hofmann and W. Benecke, "Two-dimensional scanning using two single-axis low voltage PZT resonant micromirrors", Proc. SPIE 8977, MOEMS and Miniaturized Systems XIII, 897706 (7 Mar. 2014)].

SUMMARY

According to an embodiment, an apparatus may have: a micromirror; an excitation structure containing or supporting the micromirror and including at least one piezoelectric actuator, the excitation structure being configured to resonantly excite the micromirror so as to cause a deflection of the micromirror; and at least one piezoelectric sensor for providing a sensor signal dependent on the deflection of the micromirror, the piezoelectric sensor being mechanically connected to the excitation structure, so that during the resonant excitation of the micromirror, the sensor signal and the deflection of the micromirror exhibit a fixed mutual phase relationship; the excitation structure including a spring structure supporting the micromirror and being connected to the at least one piezoelectric actuator; the excitation structure including two piezoelectric actuators, and the spring structure being arranged between the two piezoelectric actuators; and the at least one piezoelectric sensor being connected to the spring structure so as to move along with the spring structure; and the at least one piezoelectric sensor extending at least partially across the spring structure 130.

According to another embodiment, a method of producing an apparatus as claimed in claim 1 may have the steps of: providing a semiconductor substrate; applying an insulating layer on the semiconductor substrate; applying a piezoelectric layer on the insulating layer; and patterning the piezoelectric layer, the insulating layer, and the semiconductor substrate, so that the micromirror results and the excitation structure results which supports the micromirror and includes at least the one piezoelectric actuator to resonantly excite the micromirror so as to cause a deflection of the micromirror, the excitation structure including a spring structure supporting the micromirror and being connected to the at least one piezoelectric actuator, the excitation structure including two piezoelectric actuators, and the spring structure being arranged between the two piezoelectric actuators; and so that at least one piezoelectric sensor for providing a sensor signal dependent on the deflection of the micromirror results, the piezoelectric sensor being connected to the excitation structure, so that during the resonant excitation of the micromirror, the sensor signal and the deflection of the micromirror exhibit a fixed mutual phase relationship, the at least one piezoelectric sensor being connected to the spring structure so as to move along with the spring structure, the at least one piezoelectric sensor extending at least partially across the spring structure 130.

According to another embodiment, a method may have the steps of: resonantly exciting a micromirror by means of an excitation structure so as to cause a deflection of the micromirror, the excitation structure supporting the micromirror and including at least one piezoelectric actuator, the excitation structure including a spring structure supporting the micromirror and being connected to the at least one piezoelectric actuator, the excitation structure including two piezoelectric actuators, and the spring structure being arranged between the two piezoelectric actuators; and providing a sensor signal dependent on the deflection of the micromirror by means of a piezoelectric sensor, the piezoelectric sensor being connected to the excitation structure, so that during the resonant excitation of the micromirror, the sensor signal and the deflection of the micromirror exhibit a fixed mutual phase relationship; the at least one piezoelectric sensor being connected to the spring structure so as to move along with the spring structure, the at least one piezoelectric sensor extending at least partially across the spring structure 130.

Another embodiment may have a computer program for performing the method as claimed in claim 13 when the computer program is executed on a computer or microprocessor.

Embodiments of the present invention provide an apparatus having a micromirror, an excitation structure containing or supporting the micromirror, and at least one piezoelectric sensor. The excitation structure comprises at least one piezoelectric actuator, the excitation structure being configured to resonantly excite the micromirror to cause a deflection of the micromirror. The at least one piezoelectric sensor is configured to provide a sensor signal dependent on the deflection of the micromirror, the at least one piezoelectric sensor being connected to the excitation structure, so that during said resonant excitation of the micromirror, the sensor signal and the deflection of the micromirror exhibit a fixed mutual phase relationship.

In embodiments, the at least one piezoelectric sensor can be connected to the excitation structure such that during said resonant excitation of the micromirror, the sensor signal and the deflection of the micromirror exhibit a fixed mutual phase relationship with regard to frequency changes in the range of a fixed mode, e.g. the first longitudinal mode.

The present invention is based on the finding that the deflection (or oscillation) of the micromirror and the sensor signal of the piezoelectric sensor exhibit a fixed mutual phase relationship when the micromirror is resonantly excited, i.e. when the excitation structure and the micromirror form a fixed mechanical mode shape, and the piezoelectric sensor is connected to the excitation structure such that the piezoelectric sensor moves along with the excitation structure.

Embodiments allow implementation of a monolithically producible position sensor for a piezoelectrically resonant micromirror, the sensor signal of which is suitable for controlling in a closed-loop control. For this purpose, conventional piezoresistive and capacitive measurement methods are—because of additional production steps—either not very attractive, comparatively insensitive (capacitive) or susceptible to failure (capacitive, piezoresistive). Conventional measurement methods based on metallic strain measuring strips may use, for the former, a sufficiently large area and a suitable design, while conventional measurement methods based on an optical process involve a comparatively expensive design which includes many components to be adjusted.

Further embodiments of the present invention provide a method comprising:
  resonantly exciting a micromirror by means of an excitation structure to cause a deflection of the micromirror, the excitation structure supporting the micromirror and comprising at least one piezoelectric actuator; and
  providing a sensor signal dependent on the deflection of the micromirror by means of a piezoelectric sensor, the piezoelectric sensor being connected to the excitation structure, so that during the resonant excitation of the micromirror the sensor signal and the deflection of the micromirror exhibit a fixed mutual phase relationship.

Further embodiments of the present invention provide a method for producing an apparatus for resonantly exciting a micromirror and providing a sensor signal dependent on a deflection of the micromirror, the method comprising:
  providing a semiconductor substrate;
  applying an insulating layer on the semiconductor substrate;
  applying a piezoelectric layer on the insulating layer; and
  patterning the piezoelectric layer, the insulating layer, and the semiconductor substrate, so that the micromirror results and the excitation structure results, which supports the micromirror and comprises at least the one piezoelectric actuator to resonantly excite the micromirror so as to cause a deflection of the micromirror, and so that at least one piezoelectric sensor for providing a sensor signal dependent on the deflection of the micromirror results, the piezoelectric sensor being connected to the excitation structure, so that during the resonant excitation of the micromirror, the sensor signal and the deflection of the micromirror exhibit a fixed mutual phase relationship.

BRIEF DESCRIPTION OF THE DRAWINGS

Embodiments of the present invention will be detailed subsequently referring to the appended drawings, in which.

DETAILED DESCRIPTION OF THE INVENTION

In the following description of the embodiments of the invention, elements that are identical or have identical functions will be provided with the same reference numerals in the figures, such that their descriptions are interchangeable in the various embodiments.

Figure 1:
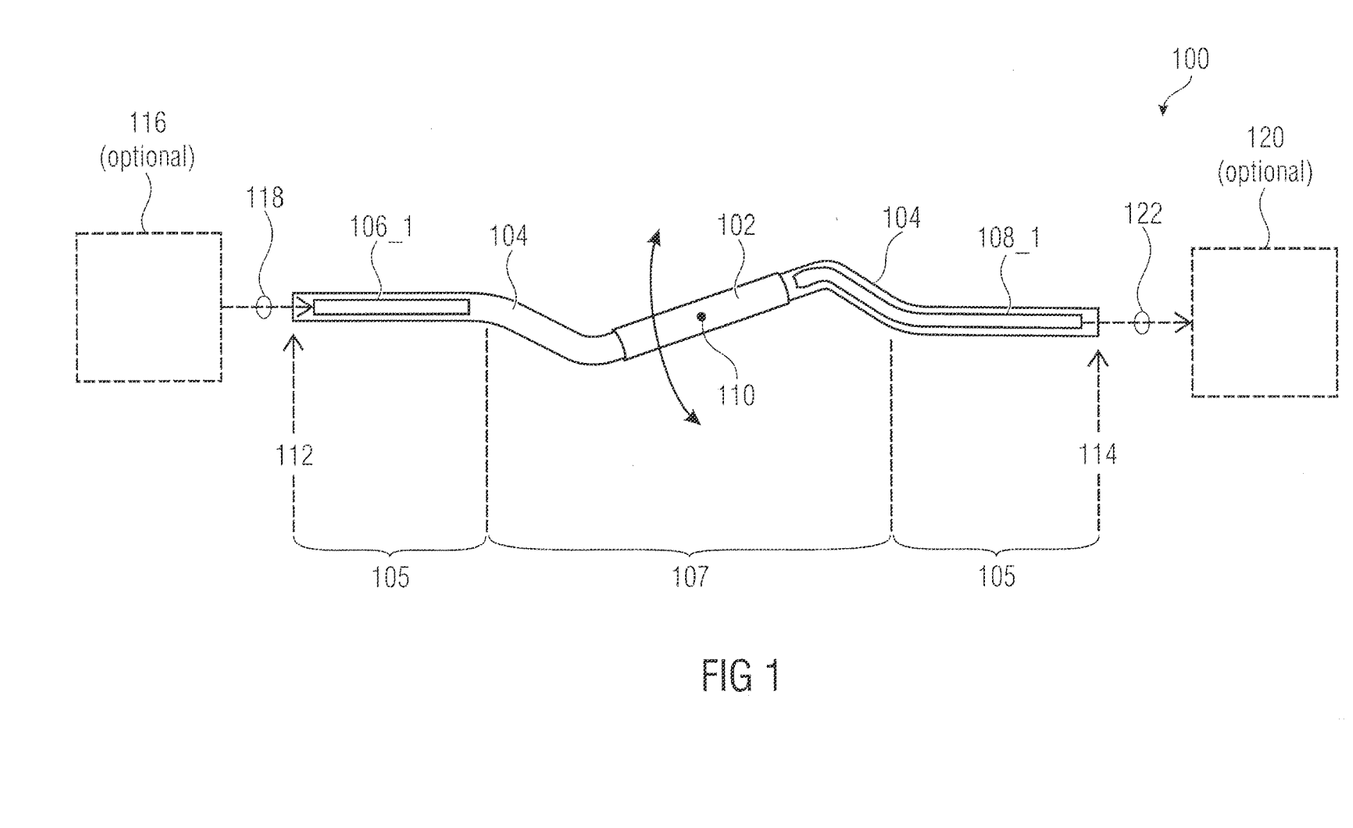
FIG. 1 shows a schematic cross-sectional view of an apparatus for resonantly exciting a micromirror and providing a sensor signal dependent on a deflection of the micromirror, according to an embodiment of the present invention.

FIG. 1 shows an apparatus 100 for resonantly exciting a micromirror 102 and providing a sensor signal 122 dependent on a deflection of the micromirror 102. The apparatus 100 comprises an excitation structure 104 which contains, or supports, the micromirror 102 and comprises at least one piezoelectric actuator 106_1 to 106_n (n=1), the excitation structure 104 being configured to resonantly excite the micromirror 102 to cause a deflection (or oscillation or vibration) of the micromirror 102. In addition, the apparatus 100 comprises at least one piezoelectric sensor 108_1 to 108_m (m=1) for providing the sensor signal 122, the at least one piezoelectric sensor 108_1 to 108_m (m=1) being connected to the excitation structure 104, so that during the resonant excitation of the micromirror 102, the sensor signal and the deflection (or oscillation or vibration) of the micromirror 102 exhibit a fixed mutual phase relationship.

In embodiments, the at least one piezoelectric sensor 108_1 to 108_m (m=1) may be connected to the excitation structure 102 such that the at least one piezoelectric sensor 108_1 to 108_m moves along with the excitation structure 104. In other words, the at least one piezoelectric sensor 108_1 to 108_m (m=1) may be connected to the excitation structure 104 such that the at least one piezoelectric sensor 108_1 to 108_m (m=1) joins in in the movement, or deformation, or bending, of the excitation structure 104 caused by the at least one piezoelectric actuator 106_1 to 106_n (n=1).

The apparatus 100 shown in FIG. 1 comprises a piezoelectric actuator 106_1 to 106_n (n=1) and a piezoelectric sensor 108_1 to 108_m (m=1), for example. However, the invention is not limited to such embodiments. In embodiments, the apparatus 100 may comprise up to n piezoelectric actuators 106_1 to 106_n, n being a natural number larger than one, n≥1. In addition, the apparatus 100 may comprise up to m piezoelectric sensors 108_1 to 108_m, m being a natural number larger than one, m≥1.

As may be seen in FIG. 1, the micromirror 102 may be deflected about a torsion axis (or deflection axis) 110, or may oscillate about the torsion axis 110. In this context, the excitation structure 104 may be axially symmetrical to the torsion axis 110 of the micromirror 102.

As was already mentioned, the excitation structure 104 may be configured to resonantly excite the micromirror 102. For example, the excitation structure 104 may be configured as a resonator for this purpose. Moreover, the excitation structure 104 may be configured to form a fixed mechanical mode shape during the resonant excitation of the micromirror 102, such as the second longitudinal mode shape, for example, i.e. with the shape of a full, or complete, sinusoidal oscillation.

The ends 112 and 114 of the excitation structure 104 may be fixedly clamped, for example, in a clamp, e.g. a frame, e.g. a silicon frame.

In addition, the excitation structure 104 may comprise areas of different levels of elasticity, or areas of different moduli of elasticity 105 and 107. The at least one piezoelectric actuator 106_1 to 106_n (n=2) may be arranged within a first area of elasticity 105 of the excitation structure, while the excitation structure 104 supports the micromirror 102 within a second area of elasticity 107, the second area of elasticity 107 comprising a higher level of elasticity than the first area of elasticity 105. The at least one piezoelectric sensor 108_1 to 108_m (m=1) may be at least partially arranged within the second area of elasticity 107 of the excitation structure 104. The second area of elasticity 107, i.e. that area of the excitation structure 104 that has a higher level of elasticity, may be formed, for example, by a spring structure (see, e.g., FIGS. 2 and 3).

In embodiments, the apparatus 100 may further comprise a control means 116 which may be configured to provide a control signal 118 for controlling the at least one piezoelectric actuator 106_1 to 106_n (n=1), so that the excitation structure 104 forms a fixed mechanical mode shape, e.g. the second longitudinal mode shape.

In addition, the apparatus 100 may comprise an evaluating means 120 configured to evaluate the sensor signal 122 and to determine the current deflection of the micromirror 102 on the basis of the fixed phase relationship between the deflection (or oscillation) of the micromirror 102 and the sensor signal 122. The evaluating means 120 may further be configured to evaluate the sensor signal 122 and to determine an amplitude of the deflection of the micromirror 102 on the basis of an amplitude of the sensor signal 122.

Figure 2:
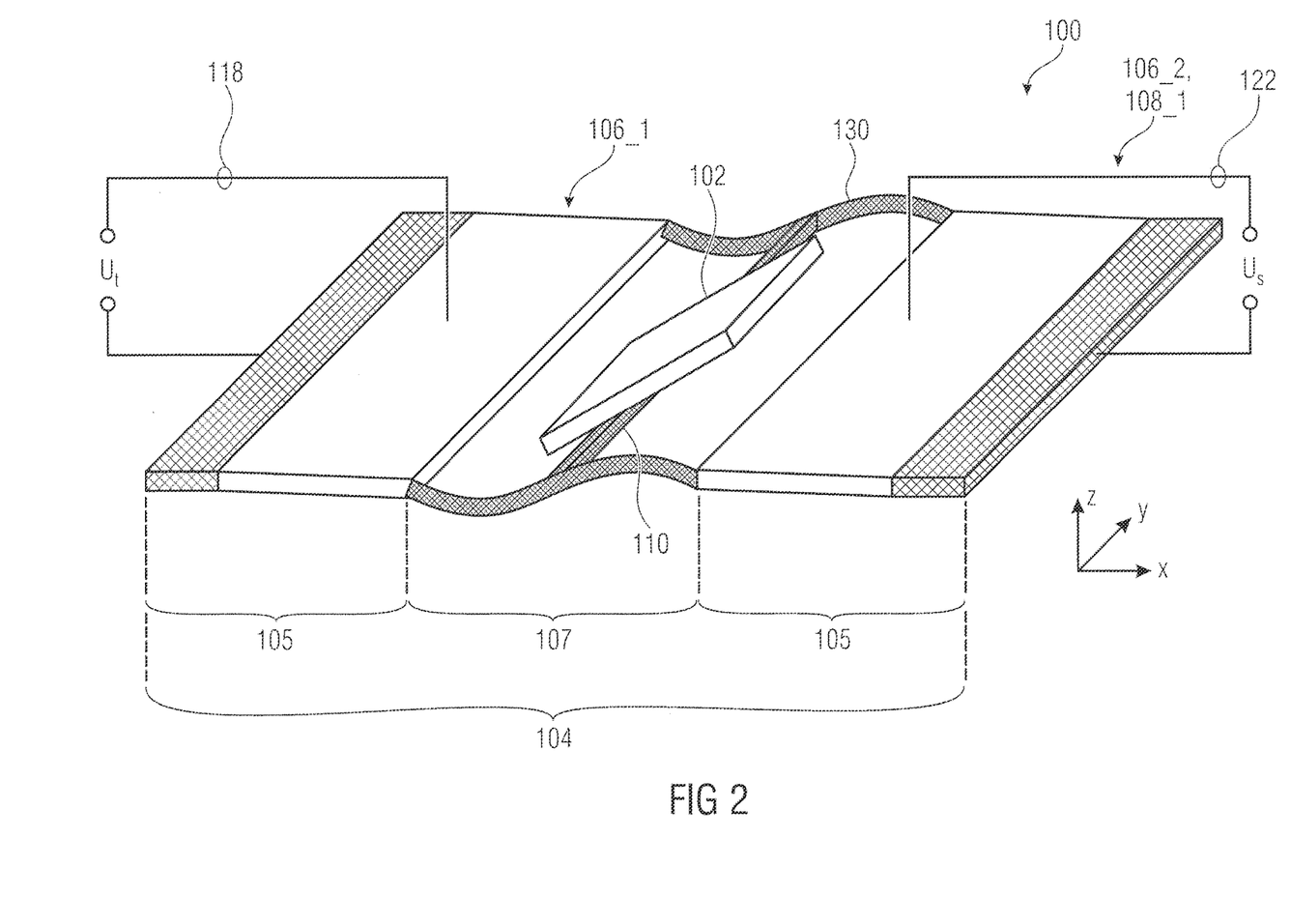
FIG. 2 shows a schematic view of an apparatus for resonantly exciting a micromirror and providing a sensor signal dependent on a deflection of the micromirror, the apparatus comprising two piezoelectric actuators, one of the two piezoelectric actuators being used as a piezoelectric sensor.

FIG. 2 shows a schematic view of the apparatus 100 for resonantly exciting a micromirror 102 and providing a sensor signal 122 dependent on a deflection of the micromirror 102. The excitation structure 104 may comprise a spring structure 130 which supports the micromirror 102 and is connected to the at least one piezoelectric actuator 106_1 to 106_n (n=2).

In embodiments, the excitation structure 104 may comprise two piezoelectric actuators 106_1 and 106_n (n=2), it being possible for the spring structure 130 to be (symmetrically) arranged between the two piezoelectric actuators 106_1 and 106_n (n=2), as can be seen in FIG. 2.

The two piezoelectric actuators 106_1 to 106_n (n=2) are arranged in a first area of elasticity 105 of the excitation structure 104, whereas the spring structure 130 forms a second area of elasticity 107 of the excitation structure 104, the second area of elasticity 107 having a higher level of elasticity than the first area of elasticity 105.

As can also be seen in FIG. 2, one of the two piezoelectric actuators 106_1 to 106_n (n=2) may be used as the at least one piezoelectric sensor 108_1 to 108_m (m=1).

In other words, a first piezoelectric actuator 106_1 of the two piezoelectric actuators 106_1 and 106_n (n=2) may be configured to resonantly excite the micromirror 102 so as to cause a deflection of the micromirror 102. To this end, a control signal 118, such as a control voltage $U_t$, for example, may be applied to the first piezoelectric actuator 106_1 such that the first piezoelectric actuator 106_1 resonantly excites the micromirror 102 so as to cause a deflection of the micromirror 102. In this case, no control signal will be applied to the second piezoelectric actuator 106_2, but a sensor signal 122, such as a sensor voltage $U_s$, for example, will be tapped, which may be evaluated, e.g. by the evaluating means 120 so as to determine the current deflection of the micromirror 102 on the basis of the fixed phase relationship (or phase position or phase shift) between the sensor signal 122, e.g. the sensor voltage $U_s$, and the deflection of the micromirror 102.

In other words, FIG. 2 shows a schematic representation of the implementation of the direct piezoelectric measurement method for 1D resonant micromirrors 102 ($U_t$: drive voltage, $U_s$: sensor signal).

The direct piezoelectric effect is the property of piezoelectric materials to convert mechanical energy to electrical energy. This represents a possibility of detecting the movements of the micromirrors 102 by means of piezoelectric sensors 108_1 to 108_m.

The indirect piezoelectric effect is used for driving the 1D resonant micromirrors (see FIG. 2). While the drive voltage $U_t$ is applied to one of the piezoelectric actuators 106_1, the voltage $U_s$ created by the direct piezoelectric effect is provided by the other actuator 106_2 used as the sensor 108_1 and is detected, or measured, e.g. by the evaluating means 120.

The mirror 102 is driven either via periodic excitation of one of the two actuators 106_1 or by both actuators 106_1 and 106_2, the excitation of which will then be performed such that they are mutually phase shifted by 180°. Both actuators 106_1 and 106_n (n=2) are identical and are symmetrically arranged about the torsion axis 110 of the mirror 102, to which they are connected by suitable spring structures 130. The actuators 106_1 to 106_n (n=2) may additionally be provided with piezoelectric sensor structures 108_1 to 108_m (cf. FIG. 3), or may be used as sensors themselves. Any electrical crosstalk between a sensor and an actuator may be achieved by means of complete galvanic separation (not even a common mass electrode).

In the simplest case, the mirror 102 may be excited unilaterally, and the opposite actuator 106_2 will then act as a pure piezoelectric sensor element.

In this case, the mirror plate 102 is initially periodically excited by the first actuator 106_1 via the intermediate spring structures 130, and is deflected, whereupon the mirror torsion transmits antiphase movements to the second actuator 106_2. Thereby, the piezoelectric voltage induced in the second actuator 106_2 reflects the mechanical deflection of the mirror 102.

With specific resonant frequencies, a particularly large amplitude of the mirror deflection is achieved. Due to the mechanical coupling between actuator, mirror plate and sensor, the periodic signals, or deflections, not only exhibit the same frequencies; rather, the amplitudes of the signals of the sensor and the adjustment of the mirror 102 are directly proportional.

However, fixed frequencies and a proportionality of the sensor characteristic on their own are not sufficient; additionally, the relative relationships of the phases between the periodic sensor signal 122 and the period tilting of the mirror 102 may be known in order to detect the precise location of the mirror 102.

What might be critical in this context is, in particular, the occurrence of phase shifts between the different components of the system as is the case, e.g., in a harmonic mechanical oscillator while an external force is excited, when the excitation frequency is shifted across the actual resonant frequency. This results in shifts by 180°, which additionally may occur near the resonance (depending on the attenuation) within a small change in frequency. Since there are also thermal effects that occur with MEMS resonators and, in particular, micromirrors, which effects eventually lead to a drift (i.e. shift) in the resonant frequency, and since in addition, comparatively small attenuation losses occur in the micro-technically produced resonators, large phase shifts may very readily occur between the excitation signal and the current position of the oscillator.

Unlike classical oscillators driven externally, the sensor element here represents an integral part of the resonator, which forms fixed mechanical mode shapes in resonance (standing wave). Within each mode, the relative phase positions between the individual elements of the resonator remain constant even when the excitation frequency varies in relation to the resonant frequency. Depending on the mode that is being excited, however, the phase positions between the individual elements may change, and they represent characteristics of the respective modes.

However, for operating the micromirror 102, the second mode, or second longitudinal mode, is particularly advantageous, which—just like a sine wave—generates as large a torsion as possible in the area of the torsion of the mirror.

Figure 3:
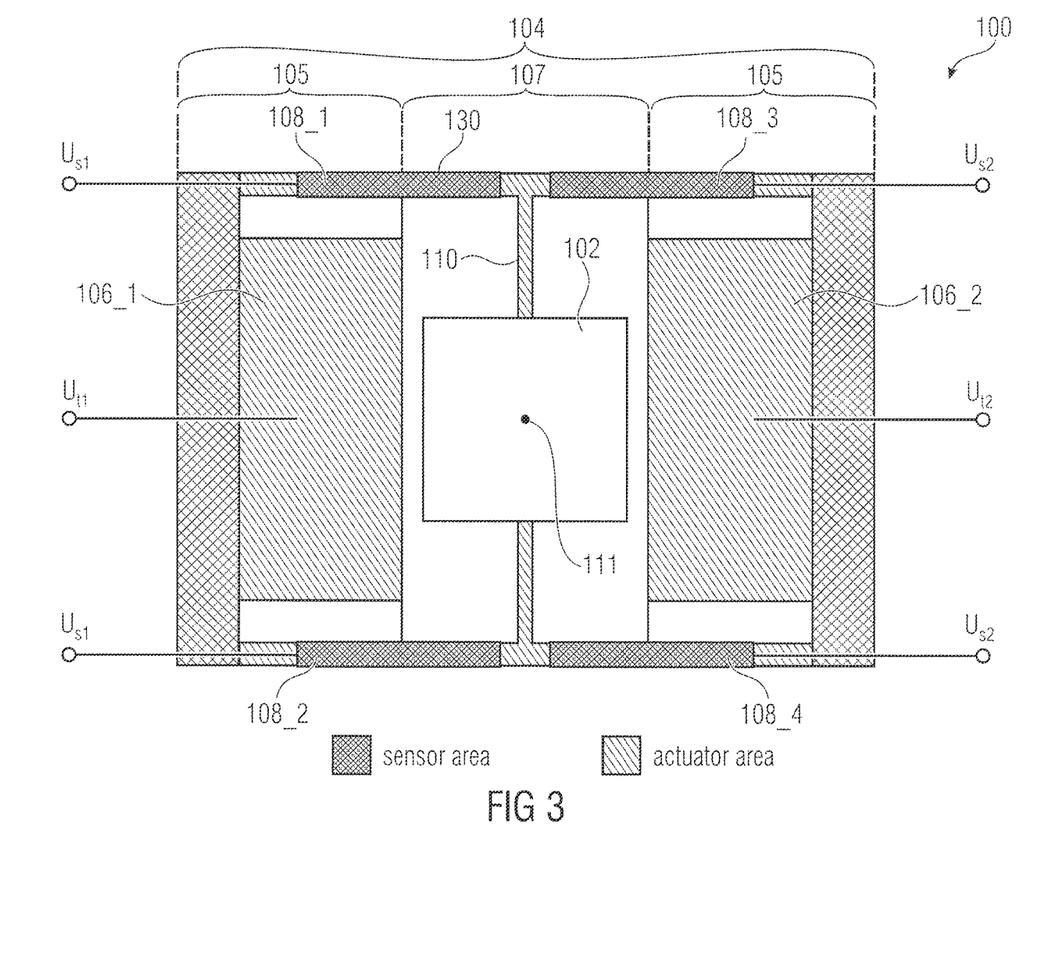
FIG. 3 shows a schematic top view of an apparatus for resonantly exciting a micromirror and providing a sensor signal dependent on a deflection of the micromirror, the apparatus comprising two piezoelectric actuators and at least one piezoelectric sensor, according to an embodiment of the present invention.

FIG. 3 shows a schematic top view of an apparatus 100 for resonantly exciting a micromirror 102 and providing a sensor signal 122 dependent on a deflection of the micromirror 102. As can be seen in FIG. 3, the excitation structure 104 comprises a spring structure 130 and two piezoelectric actuators 106_1 and 106_n (n=2), the spring structure 130 being (symmetrically) arranged between the two piezoelectric actuators 106_1 and 106_n (n=1).

In addition, the apparatus 100 shown in FIG. 3 comprises four piezoelectric sensors 108_1 to 108_m (m=4). The four piezoelectric sensors 108_1 to 108_m (m=4) are symmetrical to the torsion axis 110 of the micromirror 102, specifically, they are arranged symmetrically to a center of gravity 111 of the micromirror 102, or a center 111 of the torsion axis 110 of the micromirror 102. In addition, the four piezoelectric sensors 108_1 to 108_m (m=4) are each connected to the spring structure 130 so as to move along with the spring structure 130. Moreover, the four piezoelectric sensors 108_1 to 108_m (m=4) at least partially extend across the spring structure 130, specifically across the first area of elasticity 105 and the second area of elasticity 107 of the excitation structure 104, respectively.

The apparatus 100 shown in FIG. 3 which comprises the two piezoelectric actuators 106_1 and 106_n (n=2) and the four piezoelectric sensors 108_1 and 108_m (m=4) may be obtained, for example, by providing a semiconductor substrate, by depositing a piezoelectric layer onto the semiconductor substrate, and by subsequently patterning the piezoelectric layer and the semiconductor substrate, so that the areas shown in FIG. 3 are obtained, which form the two piezoelectric actuators 106_1 and 106_n (n=2) as well as the four piezoelectric sensors 108_1 and 108_m (m=4).

In other words, FIG. 3 shows a schematic representation of the direct piezoelectric measurement method with measuring strips for 1D micromirrors ($U_t$: drive voltage, $U_s$: sensor signal).

In principle, the piezoelectric sensors 108_1 to 108_m (m=4) may also be placed on the springs 130 (see FIG. 3). While a large portion of the PZT actuators (PZT=Blei-Zirkonat-Titanat, lead zirconium titanate) serves to provide drive, thin PZT strips 108_1 to 108_m (m=4) are laid over the connecting springs 130 since they accommodate those areas which have the highest levels of strain in the mirror torsion.

However, what seems to be particularly advantageous are arrangements of the piezo sensors 108_1 to 108_m instead of a second actuator or in parallel with both actuators 106_1 to 106_n (n=2) since here, homogeneous (no undesired compensation for the sensor signal) and sufficiently large bends occur during operation, which is reflected in a correspondingly large sensor signal. In addition, no metallic materials need to be guided over the spring elements 130, which is why both significant attenuation losses caused by the plasticity of the metals and thermally induced effects (bimetal), which affect the stability of the resonant frequency, can be avoided. Not least, this includes areas where the sensor can be configured to be comparatively large, which also results in an improved sensor signal.

In embodiments, a complete oscillator system comprises a micromirror 102 and two external piezoelectric actuators 106_1 and 106_n (n=2). Even if the actuators 106_1 and 106_n (n=2) and the micromirror 102 have different resonant frequencies when looked at separately, this system 100 comprises a common frequency of its own and a consistent, resonant behavior. The piezoelectric material is not used for the drive only, but also for position detection.

Advantages of this are that no separate materials or manufacturing steps may be used for the piezoelectric actuators 106_1 to 106_n and the piezoelectric sensor elements 108_1 to 108_m, so that monolithic manufacturing technology may be employed, and that because of the reliable resonance of the entire system 100, a constant movement ratio exist between the piezoelectric sensors 108_1 to 108_m and the micromirror 102, whereby the actuator movement is actually detected, which, however, accurately reflects the movement of the micromirror 102.

Figure 4:
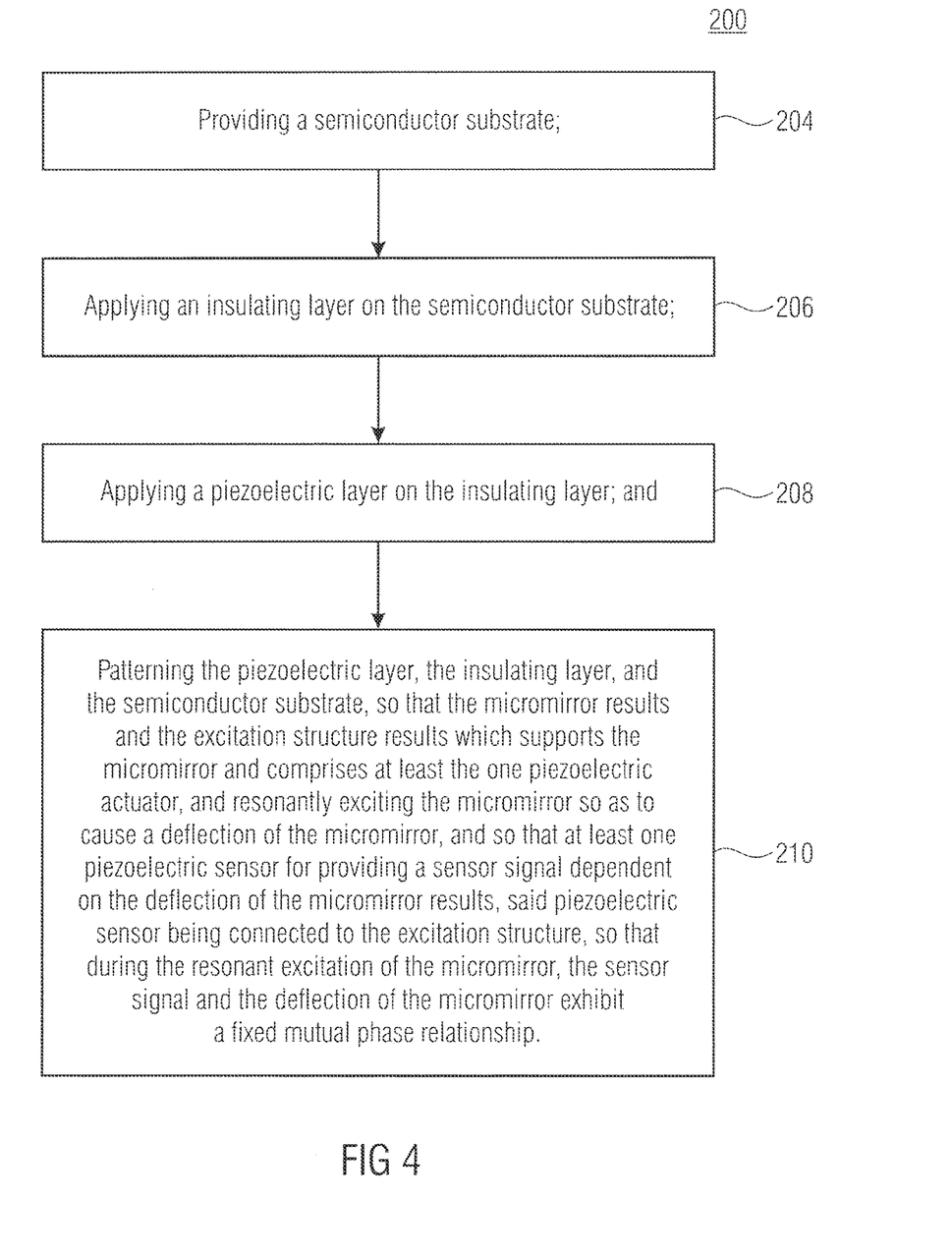
FIG. 4 shows a flowchart of a method for producing the apparatus shown in FIG. 1 according to an embodiment of the present invention.

FIG. 4 shows a flowchart of a method 200 for producing the apparatus 100 shown in FIG. 1. The method includes a step 204 of providing a semiconductor substrate; a step 206 of applying an insulating layer on the semiconductor substrate; a step 208 of applying a piezoelectric layer on the insulating layer; and a step 210 of patterning the piezoelectric layer, the insulating layer, and the semiconductor substrate, so that the micromirror 102 results and the excitation structure 104 results which supports the micromirror 102 and comprises at least the one piezoelectric actuator 106_1 to 106_n to resonantly excite the micromirror 102 so as to cause a deflection of the micromirror 102, and so that at least one piezoelectric sensor 108_1 to 108_m for providing a sensor signal dependent on the deflection of the micromirror 102 results, the at least one piezoelectric sensor 108_1 to 108_m being connected to the excitation structure 104, so that during the resonant excitation of the micromirror 102, the sensor signal and the deflection of the micromirror 102 exhibit a fixed mutual phase relationship.

In embodiments, step 208 of applying the piezoelectric layer may comprise a step of applying a first electrode layer, e.g. comprised of aluminum, platinum and/or titanium, to the insulating layer; a step of applying a lead zirconium titanate layer to the first electrode layer; and a step of applying a second electrode layer, e.g. comprised of chromium or gold, to the lead zirconium titanate layer.

In the following, the method 200 shown in FIG. 4 for producing the apparatus 100 shown in FIG. 1 will be explained in more detail with reference to FIGS. 5a to 5d.

Figure 5A:
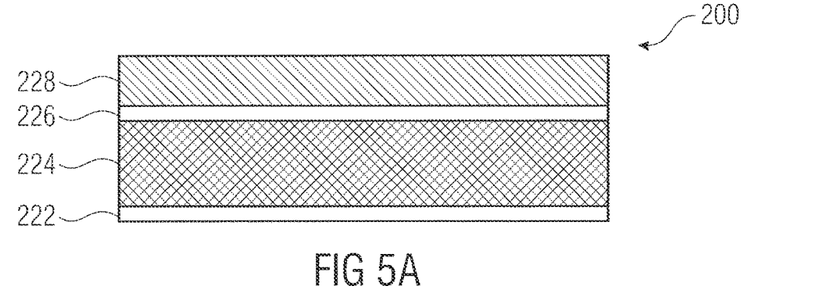
FIG. 5a-d show cross sections of the apparatus for resonantly exciting a micromirror and providing a sensor signal dependent on a deflection of the micromirror according to different steps of the production method shown in FIG. 4.

FIG. 5a shows a schematic cross-sectional view of the apparatus following step 204 of providing the semiconductor substrate 220. The semiconductor substrate 220 may comprise silicon, for example. As can be seen in FIG. 5a, the semiconductor substrate 220 may, in embodiments, be an SOI (silicon on insulator) wafer. The semiconductor substrate 220 may comprise a stack comprised of a first silicon dioxide layer 222 (e.g. having a thickness of 1 μm), a silicon layer 224 (e.g. having a thickness of 725 μm), a second silicon dioxide layer 226 (e.g. having a thickness of 1 μm), and a polysilicon layer 228 (e.g. having a thickness of 80μ).

Figure 5B:
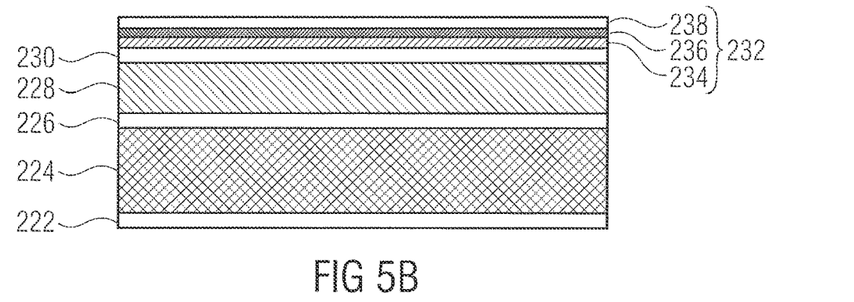

FIG. 5b shows a cross-sectional view of the apparatus 100 following step 206 of applying an insulating layer 230 on the semiconductor substrate 220 and step 208 of applying the piezoelectric layer 232 on the insulating layer 230. The piezoelectric layer 232 may comprise, for example, a stack comprised of a first electrode layer (e.g. titanium and/or platinum) 234, a lead zirconium titanate layer 236, and a second electrode layer (e.g. chromium and/or gold).

The first electrode layer 234 may be applied to the second silicon dioxide layer 226 by means of vapor deposition, for example. The lead zirconium titanate layer 236 (e.g. having a thickness of 2 μm) may be sputtered onto the first electrode layer 234, for example, e.g. while using a hot magnetron.

Figure 5C:
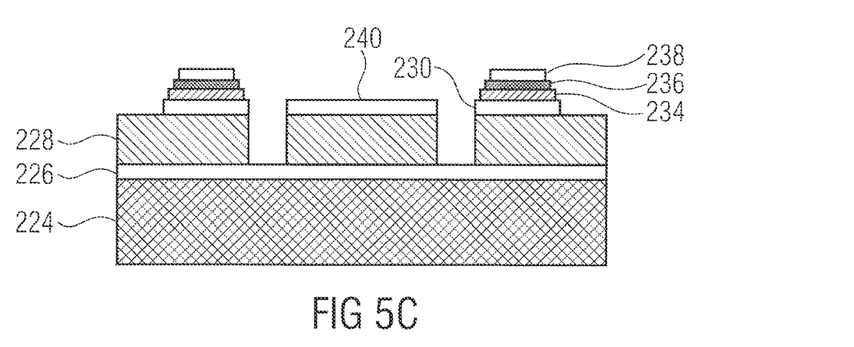

FIG. 5c shows a cross-sectional view of the apparatus 100 following step 208 of patterning the piezoelectric layer 232, the insulating layer 230 and the polysilicon layer 228 of the semiconductor substrate 220. Initially, the second electrode layer (e.g. chromium and/or gold) 238 may be patterned by means of wet etching, while the lead zirconium titanate layer 236 and the first electrode layer (e.g. titanium and/or platinum) 234 may be patterned by means of dry etching. The polysilicon layer 228 may be patterned by means of deep reactive ion etching, it being possible to deposit an optically reflecting layer, e.g. an aluminum layer 240, prior to performing said deep reactive ion etching of the polysilicon layer, so as to obtain the micromirror.

Figure 5D:
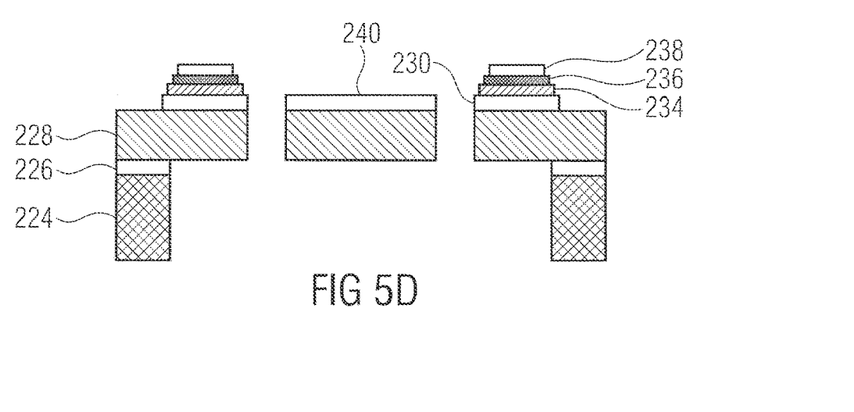

FIG. 5d shows a cross-sectional view of the apparatus 100 following step 208 of patterning the silicon layer 224 and the second silicon dioxide layer 226 of the semiconductor substrate 220. The silicon layer 224 and the second silicon dioxide layer 226 may be patterned by means of rear deep reactive ion etching, for example, so that the micromirror is exposed.

Figure 6:
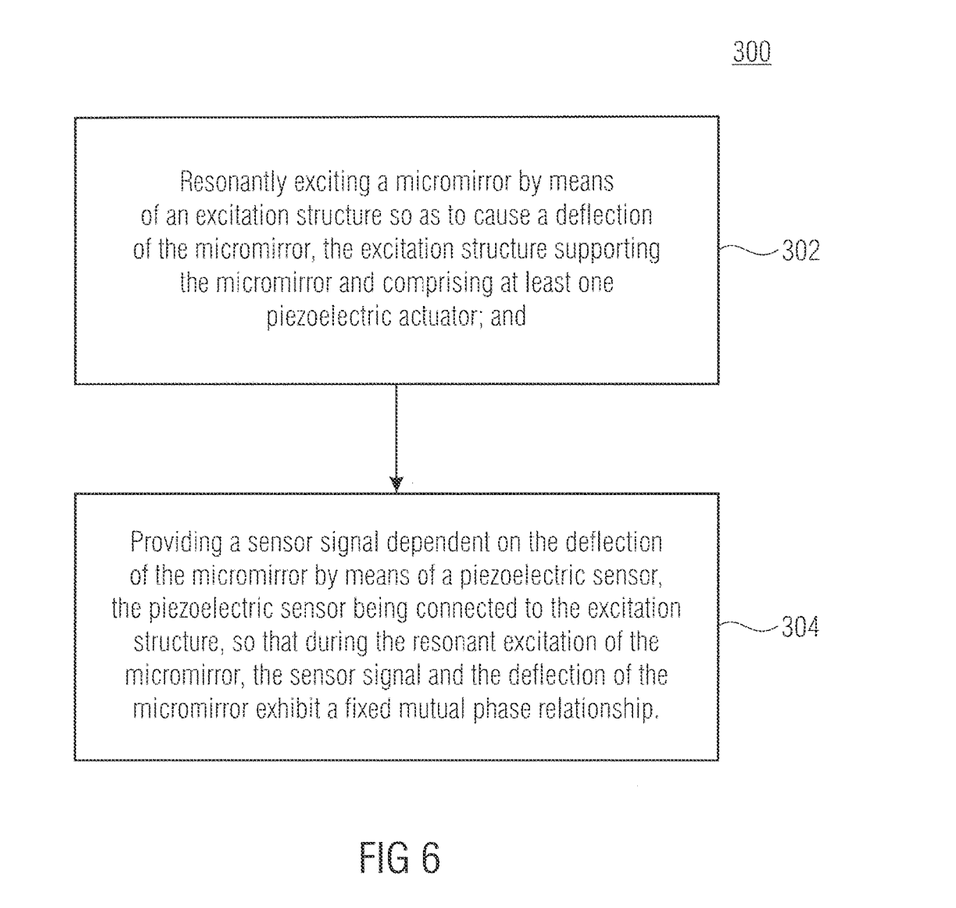
FIG. 6 shows a flowchart of a method for resonantly exciting a micromirror and providing a sensor signal dependent on a deflection of the micromirror, according to an embodiment of the present invention.

FIG. 6 shows a method 300 for resonantly exciting a micromirror 102 and providing a sensor signal dependent on the deflection of the micromirror 102. The method 300 includes a step 302 of resonantly exciting the micromirror 102 by means of an excitation structure 104 so as to cause a deflection of the micromirror 102, the excitation structure 104 supporting the micromirror 102 and comprising at least one piezoelectric actuator 106_1 to 106_n; and a step 304 of providing a sensor signal dependent on the deflection of the micromirror 102 by means of at least one piezoelectric sensor 108_1 to 108_m, the at least one piezoelectric sensor 108_1 to 108_m being connected to the excitation structure, so that during the resonant excitation of the micromirror 102, the sensor signal and the deflection of the micromirror 102 exhibit a fixed mutual phase relationship.

In embodiments, the micromirror 102 may be made to resonate by means of piezoelectricity.

In embodiments, the entire structure 100 may be designed symmetrically, it being possible for the micromirror 102 to be comprised by the drive sensor structures.

In embodiments, the entire element may be produced at the wafer level by means of silicon technology, it being possible to produce a multitude of identical MEMS devices in each case.

In embodiments, the integrated piezo actuators 106_1 to 106_n may comprise thin silicon structures onto which a thin piezoelectric layer, typically a PZT layer (lead zirconium titanate), and its electrodes are mounted.

In embodiments, the apparatus 100 may comprise additional integrated piezo sensors, or piezoelectric sensors, for detecting the angular position.

In embodiments, the piezoelectric sensors 108_1 to 108_m may be galvanically separate from the drive structures, or excitation structures 106_1 to 106_n.

In embodiments, the entire structure 100 consisting of the drives (piezoelectric actuators) 106_1 to 106_n, sensors 108_1 to 108_m, and mirror 102 may be operated in a resonant manner in a mode. This sinusoidal mode (e.g. standing wave), which may be point-symmetric about the mirror 102, results in particularly large angular movements of the mirror 102.

In embodiments, in this standing wave the actuator structures 106_1 to 106_n and sensor structures 108_1 to 108_m comprise, in relation to the position of the mirror 102, a fixed phase difference which will change only to a very small extent even in the event of frequency changes by said self-resonance. Clear shifts in the relative phase positions of the individual components will occur only in the event of excitation frequencies which considerably deviate from the resonance of this mode.

In embodiments, the amplitude of the sensor signal is proportional to the tilting of the micromirror 102.

In embodiments, the sensor signals may be used for regulating the piezoactuators 106_1 to 106_n of the drives since the relative phase difference in relation to the angular deflection of the micromirror 102 and its amplitude is known.

In embodiments, the piezoelectric sensor structures 108_1 to 108_m may be manufactured in the same manufacturing steps as the actuators 106_1 to 106_n.

Even though some aspects have been described within the context of an apparatus, it is understood that said aspects also represent a description of the corresponding method, so that a block or a structural element of an apparatus is also to be understood as a method step or as a feature of a method step. By analogy therewith, aspects that have been described within the context of or as a method step also represent a description of a corresponding block or detail or feature of a corresponding apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus comprising:
   a micromirror;
   an excitation structure comprising or supporting the micromirror and comprising at least one piezoelectric actuator, the excitation structure being configured to resonantly excite the micromirror so as to cause a deflection of the micromirror; and
   at least one piezoelectric sensor for providing a sensor signal dependent on the deflection of the micromirror, the piezoelectric sensor being mechanically connected to the excitation structure, so that during the resonant excitation of the micromirror, the sensor signal and the deflection of the micromirror exhibit a fixed mutual phase relationship;
   the excitation structure comprising a spring structure supporting the micromirror and being connected to the at least one piezoelectric actuator;
   the excitation structure comprising two piezoelectric actuators, and the spring structure being arranged between the two piezoelectric actuators; and
   the at least one piezoelectric sensor being connected to the spring structure so as to move along with the spring structure; and
   the at least one piezoelectric sensor extending at least partially along the spring structure.

2. The apparatus as claimed in claim 1, wherein the at least one piezoelectric sensor is mechanically connected to the excitation structure, the phase relationship between the sensor signal and the deflection of the micromirror exhibiting a phase shift of a maximum of 20% in the event of a frequency deviation of up to 20% from a resonant frequency of the resonant excitation.

3. The apparatus as claimed in claim 1, wherein the at least one piezoelectric sensor is connected to the excitation structure so as to move along with the excitation structure.

4. The apparatus as claimed in claim 1, wherein the piezoelectric sensor is completely galvanically separate from the at least one piezoelectric actuator.

5. The apparatus as claimed in claim 1, wherein the excitation structure is axially symmetrical to a torsion axis of the micromirror, the micromirror being deflectable about the torsion axis.

6. The apparatus as claimed in claim 1, wherein the excitation structure is configured as a resonator.

7. The apparatus as claimed in claim 6, wherein the excitation structure is configured to form a fixed mechanical mode shape during the resonant excitation of the micromirror.

8. The apparatus as claimed in claim 1, wherein an amplitude of the sensor signal is proportional to an amplitude of the deflection of the micromirror.

9. The apparatus as claimed in claim 1, the apparatus comprising a controller configured to provide a control signal for controlling the at least one piezoelectric actuator, so that the excitation structure forms a fixed mechanical mode shape.

10. The apparatus as claimed in claim 9, wherein the fixed mechanical mode shape is the second longitudinal mode.

11. The apparatus as claimed in claim 1, the apparatus comprising an evaluator configured to evaluate the sensor signal and to determine the current deflection of the micromirror on the basis of the fixed phase relationship.

12. A method of producing an apparatus as claimed in claim 1, the method comprising:
providing a semiconductor substrate;
applying an insulating layer on the semiconductor substrate;
applying a piezoelectric layer on the insulating layer; and
patterning the piezoelectric layer, the insulating layer, and the semiconductor substrate, so that the micromirror results and the excitation structure results which supports the micromirror and comprises at least the one piezoelectric actuator to resonantly excite the micromirror so as to cause a deflection of the micromirror, the excitation structure comprising a spring structure supporting the micromirror and being connected to the at least one piezoelectric actuator, the excitation structure comprising two piezoelectric actuators, and the spring structure being arranged between the two piezoelectric actuators; and so that at least one piezoelectric sensor for providing a sensor signal dependent on the deflection of the micromirror results, the piezoelectric sensor being connected to the excitation structure, so that during the resonant excitation of the micromirror, the sensor signal and the deflection of the micromirror exhibit a fixed mutual phase relationship, the at least one piezoelectric sensor being connected to the spring structure so as to move along with the spring structure, the at least one piezoelectric sensor extending at least partially along the spring structure.

13. A method comprising:
resonantly exciting a micromirror by means of an excitation structure so as to cause a deflection of the micromirror, the excitation structure supporting the micromirror and comprising at least one piezoelectric actuator, the excitation structure comprising a spring structure supporting the micromirror and being connected to the at least one piezoelectric actuator, the excitation structure comprising two piezoelectric actuators, and the spring structure being arranged between the two piezoelectric actuators; and
providing a sensor signal dependent on the deflection of the micromirror by means of a piezoelectric sensor, the piezoelectric sensor being connected to the excitation structure, so that during the resonant excitation of the micromirror, the sensor signal and the deflection of the micromirror exhibit a fixed mutual phase relationship; the at least one piezoelectric sensor being connected to the spring structure so as to move along with the spring structure, the at least one piezoelectric sensor extending at least partially along the spring structure.

14. A computer program for performing the method as claimed in claim 13 when the computer program is executed on a computer or microprocessor.

* * * * *